(12) United States Patent
Kim et al.

(10) Patent No.: US 9,324,716 B2
(45) Date of Patent: Apr. 26, 2016

(54) SEMICONDUCTOR DEVICE AND FABRICATING METHOD THEREOF

(71) Applicant: Samsung Electronics Co., Ltd., Suwon-si (KR)

(72) Inventors: Ju-Youn Kim, Suwon-si (KR); Kwang-You Seo, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/832,599

(22) Filed: Mar. 15, 2013

(65) Prior Publication Data

US 2013/0299918 A1 Nov. 14, 2013

(30) Foreign Application Priority Data

May 11, 2012 (KR) .................. 10-2012-0050344

(51) Int. Cl.

| H01L 21/76 | (2006.01) |
|---|---|
| H01L 29/78 | (2006.01) |
| H01L 27/092 | (2006.01) |
| H01L 29/423 | (2006.01) |
| H01L 29/49 | (2006.01) |
| H01L 21/8238 | (2006.01) |
| H01L 29/66 | (2006.01) |

(52) U.S. Cl.
CPC ...... *H01L 27/0924* (2013.01); *H01L 21/82385* (2013.01); *H01L 21/823821* (2013.01); *H01L 21/823842* (2013.01); *H01L 27/0922* (2013.01); *H01L 29/42376* (2013.01); *H01L 29/4966* (2013.01); *H01L 29/66545* (2013.01); *H01L 29/78* (2013.01)

(58) Field of Classification Search
CPC ..... H01L 21/768; H01L 29/423; H01L 29/78; H01L 21/28; H01L 21/336; H01L 21/8238; H01L 27/092; H01L 29/51
USPC ........... 257/347, E21.202, E21.204, E21.251, 257/E21.252, E21.409, E21.43, 2, E21.444, 257/E29.158, E29.16, E29.266, E29.345, 257/402; 438/197, 402
See application file for complete search history.

(56) References Cited

U.S. PATENT DOCUMENTS

| 7,126,199 | B2 | 10/2006 | Doczy et al. | |
|---|---|---|---|---|
| 7,148,548 | B2 | 12/2006 | Doczy et al. | |
| 7,208,361 | B2 | 4/2007 | Shah et al. | |
| 7,381,608 | B2 | 6/2008 | Brask et al. | |
| 7,517,746 | B2 | 4/2009 | Lin et al. | |
| 8,048,792 | B2 | 11/2011 | Beyer et al. | |
| 2001/0055842 | A1* | 12/2001 | Uh et al. ..................... | 438/183 |
| 2005/0272191 | A1 | 12/2005 | Shah et al. | |

(Continued)

FOREIGN PATENT DOCUMENTS

| JP | 2000-243953 | 9/2000 |
|---|---|---|
| JP | 2005-019892 | 1/2005 |

(Continued)

*Primary Examiner* — Allen Parker
*Assistant Examiner* — Didarul Mazumder
(74) *Attorney, Agent, or Firm* — Myers Bigel & Sibley, P.A.

(57) ABSTRACT

A semiconductor device includes an interlayer insulating film formed on a substrate and including a trench, a gate insulating film formed in the trench, a work function adjusting film formed on the gate insulating film in the trench along sidewalls and a bottom surface of the trench, and including an inclined surface having an acute angle with respect to the sidewalls of the trench, and a metal gate pattern formed on the work function adjusting film in the trench to fill up the trench.

19 Claims, 15 Drawing Sheets

(56) References Cited

U.S. PATENT DOCUMENTS

| | | | |
|---|---|---|---|
| 2008/0265322 A1* | 10/2008 | Lin et al. | 257/347 |
| 2010/0127336 A1* | 5/2010 | Chambers et al. | 257/369 |
| 2010/0164008 A1 | 7/2010 | Mehrad et al. | |
| 2011/0193162 A1 | 8/2011 | Chuang et al. | |
| 2011/0241118 A1 | 10/2011 | Ng et al. | |
| 2012/0306026 A1* | 12/2012 | Guo et al. | 257/407 |
| 2013/0087837 A1* | 4/2013 | Chang et al. | 257/288 |

FOREIGN PATENT DOCUMENTS

| | | |
|---|---|---|
| JP | 2005-259945 | 9/2005 |
| JP | 2007-134432 | 5/2007 |

* cited by examiner

SEMICONDUCTOR DEVICE AND FABRICATING METHOD THEREOF

CROSS-REFERENCE TO RELATED APPLICATION

This application claims priority under 35 U.S.C. §119 from Korean Patent Application No. 10-2012-0050344 filed on May 11, 2012 in the Korean Intellectual Property Office, the entire content of which is incorporated herein by reference.

BACKGROUND

The present inventive concept relates to a semiconductor device and a fabricating method thereof.

As the size of metal oxide semiconductor (MOS) transistors are decreased, the length of a gate and the length of a channel formed below the gate are also reduced. Accordingly, various efforts have been made to increase the capacitance between the gate and the channel to improve the operating characteristics of the MOS transistor.

A silicon oxide film that is typically used as a gate insulating film has physical limitations in the electrical properties as the thickness is reduced. Accordingly, the use of high dielectric constant (high-k) films that have a high dielectric constant have been investigated as a replacement for silicon oxide gate insulating films in MOS transistors. When such high-k films are used, it is possible to reduce leakage current between a gate electrode and a channel region while using a thin equivalent oxide film.

Further, polysilicon which is typically used as a gate material, has a resistance that is larger than the resistance of most metals. Thus, the polysilicon gate electrode is being replaced by a metal gate electrode in many MOS transistors.

SUMMARY

The present inventive concept provides semiconductor devices having improved gap-fill characteristics.

The present inventive concept also provides methods of fabricating semiconductor devices having improved gap-fill characteristics.

The objects of the present inventive concept are not limited thereto, and other objects of the present inventive concept will be described in or be apparent from the following description of the embodiments.

According to an aspect of the present inventive concept, semiconductor devices are provided that include a substrate and have an interlayer insulating film that includes a trench on the substrate. A gate insulating film is in the trench. A work function adjusting film is on a first sidewall, a second sidewall and a bottom surface of the trench. The work function adjusting film includes an inclined surface that forms an acute angle with respect to the first sidewall of the trench. A metal gate pattern is on the work function adjusting film so as to substantially fill the trench.

According to another aspect of the present inventive concept, semiconductor devices are provided that include a substrate, an interlayer insulating film on the substrate, the interlayer insulating film having a first trench and a second trench which are separated from each other therein, an NMOS transistor including a first metal gate formed in the first trench; and a PMOS transistor including a second metal gate formed in the second trench, wherein the first metal gate includes a first N type work function adjusting film formed along first and second sidewalls and a bottom surface of the first trench, the second metal gate includes an P type work function adjusting film and a second N type work function adjusting film which are sequentially stacked along first and second sidewalls and a bottom surface of the second trench, and the second N type work function adjusting film includes a first inclined surface having an acute angle with respect to the first sidewall of the trench.

According to another aspect of the present inventive concept, semiconductor devices are provided that include an interlayer insulating film on a substrate that has a trench therein, a gate insulating film in the trench, a first TiN film on an upper surface of on the gate insulating film in the trench, a TaN film on an upper surface of the first TiN film in the trench, a second TiN film on an upper surface of the TaN film in the trench, and a TiAl film on an upper surface of the second TiN film in the trench, wherein one of the second TiN film and the TiAl film includes an inclined surface having an acute angle with respect to at least one sidewall of the trench.

According to another aspect of the present inventive concept, a method of fabricating a semiconductor device is provided in which an interlayer insulating film is formed on a substrate to include a trench, a gate insulating film is formed in the trench, a work function adjusting film is formed on the gate insulating film along sidewalls and a bottom surface of the trench and an upper surface of the interlayer insulating film, a portion of the work function adjusting film is removed such that the work function adjusting film includes an inclined surface having an acute angle with respect to the sidewalls of the trench, and a metal gate pattern is formed on the work function adjusting film to fill up the trench.

According to another aspect of the present inventive concept, methods of fabricating semiconductor devices are provided in which an interlayer insulating film is formed on a substrate that includes a first region and a second region. The interlayer insulating film includes a first trench formed in the first region and a second trench formed in the second region. A first gate insulating film is formed in the first trench and a second gate insulating film is formed in the second trench. A first work function adjusting film is formed on the second gate insulating film, the first work function adjusting film being disposed along sidewalls and a bottom surface of the second trench and an upper surface of the interlayer insulating film. A second work function adjusting film is formed on the first gate insulating film and the first work function adjusting film, the second work function adjusting film being disposed along sidewalls and a bottom surface of the first trench, the sidewalls and the bottom surface of the second trench, and the upper surface of the interlayer insulating film. A portion of the second work function adjusting film is removed such that the second work function adjusting film includes a first inclined surface having an acute angle with respect to the sidewalls of the second trench. A first metal gate pattern is formed to fill up the first trench, and a second metal gate pattern is formed to fill up the second trench.

According to another aspect of the present inventive concept, semiconductor devices are provided that include a substrate, an interlayer insulating film having a trench on the substrate, a gate insulating film on a first sidewall, a second sidewall and a bottom surface of the trench, and a work function adjusting film on the gate insulating film, the work adjusting film having first and second sidewalls and a bottom surface. Upper portions of the first sidewall and the second sidewall of the work function adjusting film are chamfered.

BRIEF DESCRIPTION OF THE DRAWINGS

The above and other aspects and features of the present inventive concept will become more apparent by describing in detail exemplary embodiments thereof with reference to the attached drawings, in which.

DETAILED DESCRIPTION OF THE EMBODIMENTS

Figure 1:
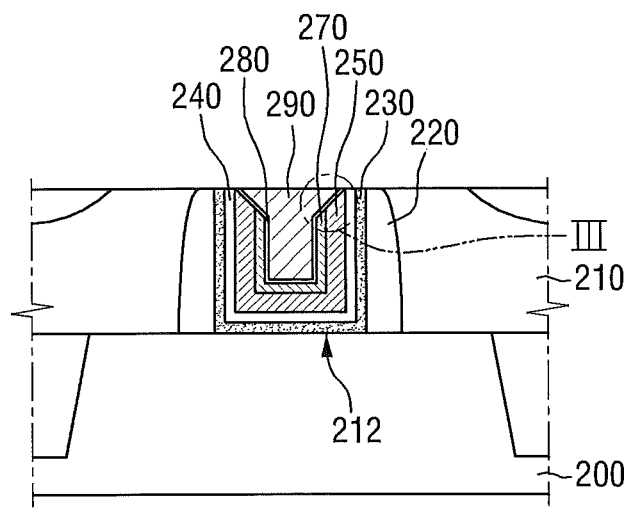
FIG. 1 is a cross-sectional view of a semiconductor device in accordance with a first embodiment of the present inventive concept.

The present invention will now be described more fully hereinafter with reference to the accompanying drawings, in which embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. The same reference numbers indicate the same components throughout the specification. In the attached figures, the thickness of layers and regions may be exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The use of the terms "a" and "an" and "the" in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this invention belongs. It is noted that the use of examples and/or exemplary terms herein is intended merely to better illuminate the invention and is not a limitation on the scope of the invention unless otherwise specified.

The present invention will be described with reference to perspective views, cross-sectional views, and/or plan views, in which embodiments of the invention are shown. Thus, the profile of an exemplary view may be modified according to manufacturing techniques and/or allowances. That is, the embodiments of the invention are not intended to limit the scope of the present invention but cover all changes and modifications that can be caused due to a change in manufacturing process. Thus, regions shown in the drawings are illustrated in schematic form and the shapes of the regions are presented simply by way of illustration and not as a limitation.

Figure 2:
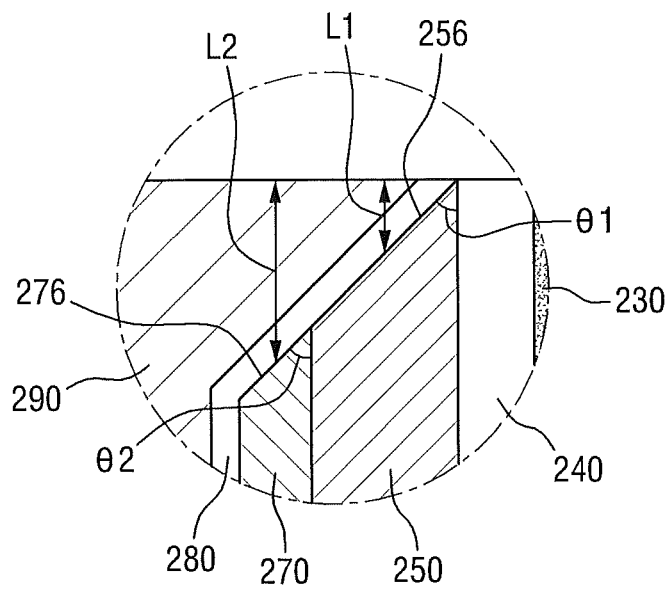
FIG. 2 is an enlarged view of a region III of FIG. 1

FIG. 1 is a cross-sectional view of a semiconductor device 1 in accordance with a first embodiment of the present inventive concept. FIG. 2 is an enlarged view of region III of FIG. 1. In FIG. 1, a gate of a PMOS transistor has been illustrated as an example, but the present inventive concept is not limited thereto.

Referring to FIG. 1, the semiconductor device 1 in accordance with the first embodiment of the present inventive concept may include a substrate 200, an interlayer insulating film 210 having a trench 212, a gate insulating film 230, an etch stop film 240, a P type work function adjusting film 250, an N type work function adjusting film 270, an adhesive film 280, a metal gate pattern 290 and the like.

An element isolation film is formed in the substrate 200 by shallow trench isolation (STI) to define an active region. The substrate 200 may be formed, for example, of at least one semiconductor material selected from the group consisting of Si, Ge, SiGe, GaP, GaAs, SiC, SiGeC, InAs and InP. Also, a silicon on insulator (SOI) substrate may be used.

The interlayer insulating film 210 may be formed on the substrate 200. A trench 212 may be provided in the interlayer insulating film 210. In some embodiments, the interlayer insulating film 210 may be formed by stacking two or more insulating films. As illustrated, spacers 220 may be formed on the sidewalls of the trench 212, and the substrate 200 may be disposed on the bottom surface of the trench 212, but they are not limited thereto. The spacers 220 may include at least one of a nitride film and an oxynitride film.

The gate insulating film 230 may be formed conformally along the sidewalls and the bottom surface of the trench 212.

The gate insulating film 230 may include a high dielectric constant (high-k) material with a dielectric constant higher than that of a silicon oxide film. For example, the gate insulating film 230 may include a material selected from the group consisting of $HfO_2$, $ZrO_2$, $Ta_2O_5$, $TiO_2$, $SrTiO_3$ and $(Ba,Sr)TiO_3$. The gate insulating film 230 may be formed to have an appropriate thickness according to the type of device that is to be formed. For example, in a case where the gate insulating film 230 is a $HfO_2$ film, the gate insulating film 230 may be formed to have a thickness of about 50 Å or less (about 5 to 50 Å).

The etch stop film 240 may be formed on the gate insulating film 230 in the trench 212. As illustrated, the etch stop film 240 may be formed conformally along the bottom surface and the sidewalls of the trench 212. The etch stop film 240 may include, e.g., at least one of TiN and TaN. Alternatively, the etch stop film 240 may be a TiN film and a TaN film that are sequentially stacked. The etch stop film 240 may be used when etching the unnecessary N type work function adjusting film 270 that is formed in a different region (see FIGS. 17 and 18). The etch stop film 240 may be formed to have an appropriate thickness according to the type of device that is to be formed. For example, if the etch stop film 240 is a TiN film, the etch stop film 240 may be formed to have a thickness of about 5 to 40 Å, and if the etch stop film 240 is a TaN film, the etch stop film 240 may be formed to have a thickness of about 5 to 30 Å.

The P type work function adjusting film 250 may be formed on the etch stop film 240 in the trench 212. As illustrated, the P type work function adjusting film 250 also may be formed conformally along the bottom surface and the sidewalls of the trench 212. The P type work function adjusting film 250 serves to adjust the operating characteristics of a P type transistor by adjusting a work function of the P type transistor. For example, the P type work function adjusting film 250 may be a TiN film, but it is not limited thereto.

The N type work function adjusting film 270 may be formed on the P type work function adjusting film 250 in the trench 212. As illustrated, the N type work function adjusting film 270 also may be formed conformally along the bottom surface and the sidewalls of the trench 212. The N type work function adjusting film 270 may adjust the operating characteristics of an N type transistor by adjusting a work function of the N type transistor. The N type work function adjusting film 270 may be included in the P type transistor without being removed if it does not impair the operating characteristics of the P type transistor. This may reduce the number of photolithography processes. The N type work function adjusting film 270 may be a material selected from the group consisting of TiAl, TiAlN, TaC, TiC and HfSi. For example, the N type work function adjusting film 270 may be a TiAl film.

The adhesive film 280 may be formed on the N type work function adjusting film 270 in the trench 212. The adhesive film 280 may include at least one of TiN and Ti. Alternatively, the adhesive film 280 may be a TiN film and a Ti film that are sequentially stacked. The adhesive film 280 may increase the adhesion of the metal gate pattern 290 that is formed subsequently.

The metal gate pattern 290 may be formed on the adhesive film 280 in the trench 212 to fill up the trench 212. The metal gate pattern 290 may be Al, W or the like, but it is not limited thereto.

As shown in FIGS. 1 and 2, the P type work function adjusting film 250 and the N type work function adjusting film 270 may be formed conformally along the bottom surface and the sidewalls of the trench 212. A first portion of the P type work function adjusting film 250 is disposed along a first sidewall of the trench 212 (the right sidewall in FIGS. 1 and 2) and a second portion of the P type work function adjusting film 250 is disposed along a second sidewall of the trench 212 (the left sidewall in FIG. 1). The first portion of the P type work function adjusting film 250 includes an inclined surface 256 having an acute angle θ1 with respect to the first sidewall of the trench 212. The second portion of the P type work function adjusting film 250 also includes an inclined surface that forms an acute angle with respect to the second sidewall of the trench 212.

The N type work function adjusting film 270 disposed along the sidewalls of the trench 212 includes a first portion that has an inclined surface 276 having an acute angle θ2 with respect to the first sidewall of the trench 212 (the right sidewall in FIGS. 1 and 2). A second portion of the N type work function adjusting film 270 also has an inclined surface that forms an acute angle with respect to the second sidewall of the trench 212 (the left sidewall in FIG. 1). Here, an inclined surface of a work function adjusting film is considered to form an acute angle with a sidewall of a trench (or another layer that is on the sidewall of the trench) if an angle measured from the sidewall of the trench to the inclined surface through the work function adjusting film is less than 90 degrees. As a result of these acute angles, the P type work function adjusting film 250 and the N type work function adjusting film 270 may each have a chamfered shape.

In the drawing, it has been illustrated that the acute angle θ1 of the inclined surface 256 is substantially the same as the acute angle θ2 of the inclined surface 276, but embodiments of the present inventive concept are not limited thereto. That is, in other embodiments, the acute angle θ1 of the inclined surface 256 may be different from the acute angle θ2 of the inclined surface 276. For example, the acute angle θ2 of the inclined surface 276 may be larger than the acute angle θ1 of the inclined surface 256, or the acute angle θ2 of the inclined surface 276 may be smaller than the acute angle θ1 of the inclined surface 256.

As illustrated, the inclined surface 256 of the P type work function adjusting film 250 and the inclined surface 276 of the N type work function adjusting film 270 may directly contact each other to form a continuous surface, but they are not limited thereto. Thus, in other embodiments, an end point of the inclined surface 256 and a start point of the inclined surface 276 may not be co-located.

As illustrated, a first average depth L1 from the upper surface of the interlayer insulating film 210 to a top surface of the P type work function adjusting film 250 may be different from a second average depth L2 from the upper surface of the interlayer insulating film 210 to a top surface of the N type work function adjusting film 270. For example, the first average depth L1 may be smaller than the second average depth L2. In embodiments where the inclined top surface of the P type work function adjusting film 250 forms a straight line, the first average depth L1 is the depth from the upper surface of the interlayer insulating film 210 to the midpoint of the inclined surface 256. Similarly, in embodiments where the inclined top surface of the N type work function adjusting film 270 forms a straight line, the second average depth L2 is the depth from the upper surface of the interlayer insulating film 210 to the midpoint of the inclined surface 276.

Since the inclined surface 256 is formed at the upper end of the P type work function adjusting film 250, the width of the upper portion of the P type work function adjusting film 250 may become smaller with increasing distance from the bottom surface of the trench 212. Since the inclined surface 276 is formed at the upper end of the N type work function adjusting film 270, the width of the upper portion of the N type work function adjusting film 270 also may become smaller with increasing distance from the bottom surface of the trench 212.

The gap-fill characteristics of the metal gate pattern 290 may be improved due to the shapes of the P type work function adjusting film 250 and the N type work function adjusting film 270. Specifically, as the size of the semiconductor device decreases, the sizes of various elements (e.g., transistors) also decrease. Thus, since the size of the trench 212 also becomes smaller, it is difficult to form multiple layers (e.g., gate insulating film, etch stop film, work function adjusting film, adhesive film, metal gate pattern, etc.) in the trench 212.

In the semiconductor device 1 in accordance with the first embodiment of the present inventive concept, since the inclined surface 256 is formed at the end point of the P type work function adjusting film 250 and the inclined surface 276 is formed at the end point of the N type work function adjusting film 270, the upper opening into the trench 212 is kept relatively wide. This may facilitate depositing a metal into the trench 212 that is used to form the metal gate pattern 290. Since the metal can fill up to a deep portion of the trench 212, the gap-fill characteristics of the metal may be improved as can the reliability of the semiconductor device 1.

Figure 3:
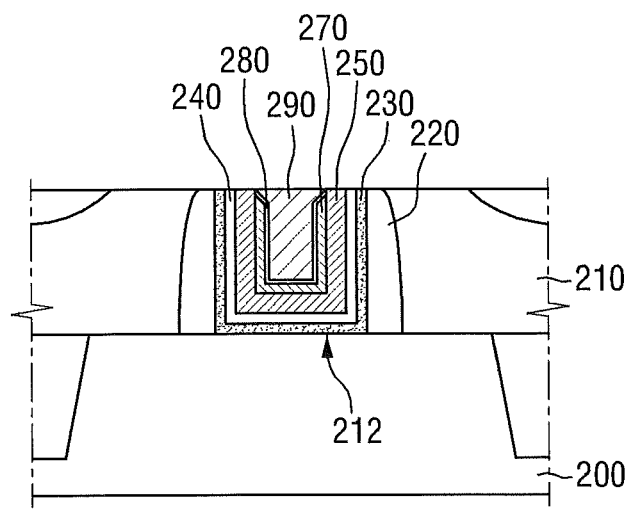
FIG. 3 is a cross-sectional view of a semiconductor device in accordance with a second embodiment of the present inventive concept.

FIG. 3 is a cross-sectional view of a semiconductor device in accordance with a second embodiment of the present inventive concept. For simplicity of description, the discussion of this embodiment below will focus on its differences from the first embodiment that is described above with reference to FIGS. 1 and 2.

In some embodiments, the inclined surface 256 may form an acute angles θ1 that is less than 80 degrees. In other embodiments, the inclined surface 256 may form an acute angle θ1 that is less than 70 degrees. In still other embodiments, the inclined surface 256 may form an acute angle θ1 that is less than 60 degrees. In still further embodiments, the inclined surface 256 may form an acute angle θ1 that is less than 45 degrees.

Similarly, in some embodiments, the inclined surface 276 may form an acute angle θ2 that is less than 80 degrees. In other embodiments, the inclined surface 276 may form an acute angle θ2 that is less than 70 degrees. In still other embodiments, the inclined surface 276 may form an acute angle θ2 that is less than 60 degrees. In still further embodiments, the inclined surface 276 may form an acute angle θ2 that is less than 45 degrees.

Note that as used herein the term "acute angle" does not encompass angles that are just a few degrees less than 90 degrees that may result, for example, from normal variation in semiconductor growth and processing operations. For example, a sidewall that is intended to be vertical may not quite be exactly vertical due to processing variations or limitations.

Referring to FIG. 3, in a semiconductor device 2 in accordance with the second embodiment of the present inventive concept, the P type work function adjusting film 250 does not include inclined surfaces (e.g., inclined surface 256) that form acute angles with respect to the sidewalls of the trench 212, but instead have non-inclined surfaces that form angles of approximately 90 degrees with respect to the first and second sidewalls of the trench 212. The N type work function adjusting film 270 may include an inclined surface 276 that forms an acute angle with respect to the first sidewall of the trench 212.

Since the N type work function adjusting film 270 includes the inclined surface 276, the entrance of the trench 212 is wider than it otherwise would be if the N type work function adjusting film 270 did not include the inclined surface 276. As discussed above, widening the upper opening into the trench 212 may make it easier to form a metal gate pattern 290 having good gap fill characteristics by depositing a metal in the trench 212.

Figure 4:
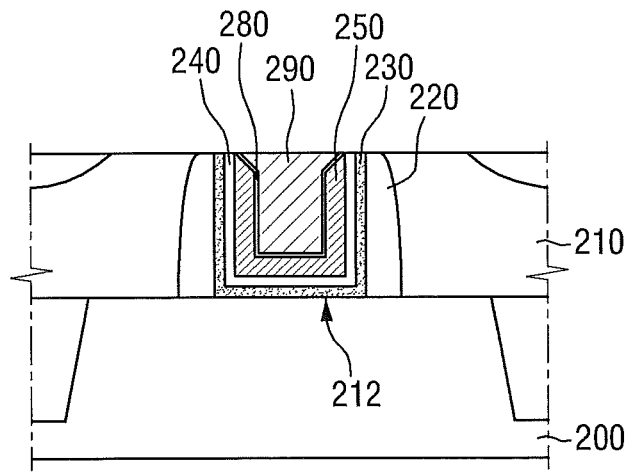
FIG. 4 is a cross-sectional view of a semiconductor device in accordance with a third embodiment of the present inventive concept.

FIG. 4 is a cross-sectional view of a semiconductor device in accordance with a third embodiment of the present inventive concept. For simplicity of description, the discussion of this embodiment will focus on its differences from the first embodiment that is described above with reference to FIGS. 1 and 2.

Referring to FIG. 4, a semiconductor device 3 in accordance with the third embodiment of the present inventive concept does not include the N type work function adjusting film 270 (see FIG. 1). As described above, the N type work function adjusting film 270 may be included in the P type transistor if it does not impair the operating characteristics of the P type transistor. However, in order to maximize the operating characteristics of the P type transistor, the N type work function adjusting film 270 may be deposited within the layer structure of the N type transistor and then removed. Since the N type work function adjusting film 270 is absent, the opening into the trench 212 is wider. Further, the P type work function adjusting film 250 may include the inclined surface 256 that forms an acute angle with respect to the first sidewall of the trench 212. As discussed above, this wider opening into the trench 212 may facilitate forming a metal gate pattern 290 having good gap fill characteristics in the trench 212.

Figure 5:
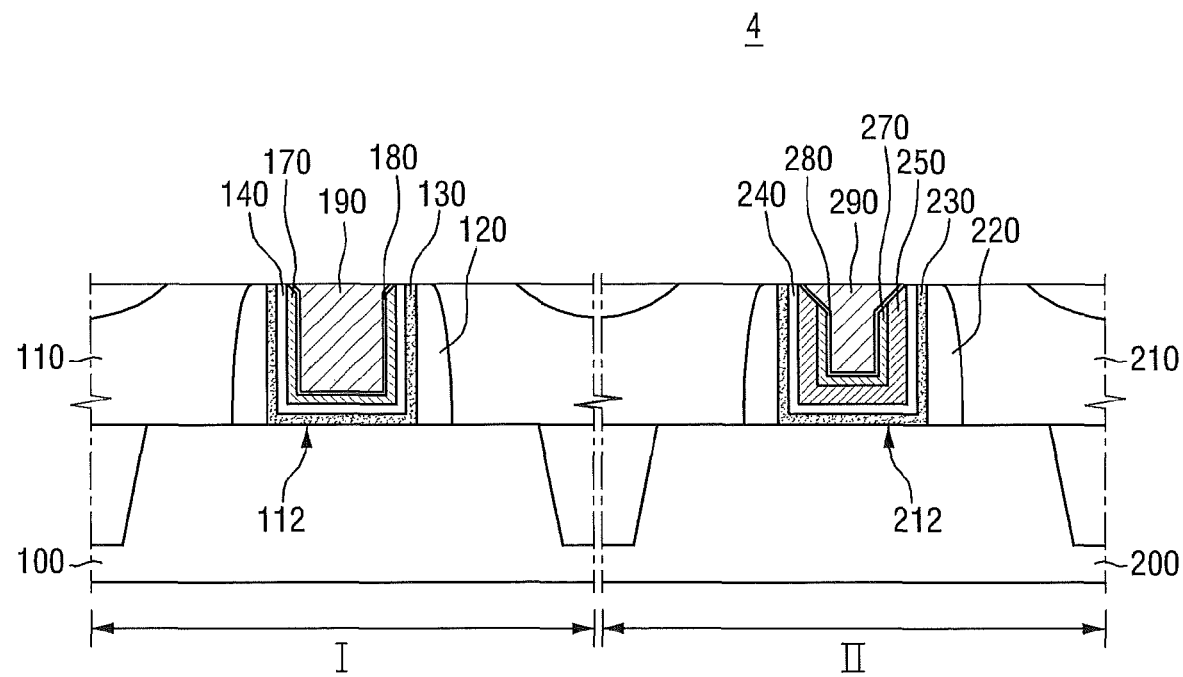
FIG. 5 is a cross-sectional view of a semiconductor device in accordance with a fourth embodiment of the present inventive concept.

FIG. 5 is a cross-sectional view of a semiconductor device 4 in accordance with a fourth embodiment of the present inventive concept. For simplicity of description, the discussion of this embodiment will focus on its differences from the first embodiment that is described above with reference to FIGS. 1 and 2.

Referring to FIG. 5, in the semiconductor device 4 in accordance with the fourth embodiment of the present inventive concept, a first region I and a second region II are defined on substrates 100 and 200. An N type transistor may be formed in the first region I and the P type transistor may be formed in the second region II.

The N type transistor may include a first replacement metal gate. The first replacement metal gate may be formed in an interlayer insulating film 110 including a trench 112.

A gate insulating film 130 may be formed conformally along the sidewalls and the bottom surface of the trench 112. The gate insulating film 130 may include a high dielectric constant (high-k) material with a dielectric constant higher than that of a silicon oxide film. For example, the gate insulating film 130 may include a material selected from the group consisting of $HfO_2$, $ZrO_2$, $Ta_2O_5$, $TiO_2$, $SrTiO_3$ and $(Ba,Sr)TiO_3$.

The first replacement metal gate may include an etch stop film 140, an N type work function adjusting film 170, an adhesive film 180 and a metal gate pattern 190. As illustrated, the etch stop film 140, the N type work function adjusting film 170 and the adhesive film 180 may be formed conformally along the bottom surface and the sidewalls of the trench 112. The etch stop film 140 may include, e.g., at least one of TiN and TaN. Alternatively, the etch stop film 140 may be a TiN film and a TaN film that are sequentially stacked. The N type work function adjusting film 170 may adjust the operating characteristics of an N type transistor by adjusting a work function of the N type transistor. The N type work function adjusting film 170 may be a material selected from the group consisting of TiAl, TiAlN, TaC, TiC and HfSi. For example, the N type work function adjusting film 170 may be a TiAl film. The adhesive film 180 may include at least one of TiN and Ti. Alternatively, the adhesive film 180 may be a TiN film and a Ti film that are sequentially stacked. The adhesive film 180 may increase the adhesion of a metal gate pattern 190 that is formed in a subsequent process. The metal gate pattern 190 may be formed on the adhesive film 180 in the trench 112 to fill up the trench 112. The metal gate pattern 190 may be Al, W or the like, but it is not limited thereto.

The N type work function adjusting film 170 may be disposed along the sidewalls of the trench 112 and may include an inclined surface 276 that forms an acute angle with respect to the first sidewall of the trench 112.

Further, the semiconductor device 4 may include a second replacement metal gate may that includes an etch stop film 240, the P type work function adjusting film 250, the N type work function adjusting film 270, the adhesive film 280, the metal gate pattern 290 and the like. The P type work function adjusting film 250 may include inclined surfaces (e.g., inclined surface 256) that form acute angles with respect to the first and second sidewalls of the trench 212. The N type work function adjusting film 270 also may include an inclined surface 276 that forms an acute angle with respect to the first sidewall of the trench 212.

Although not shown in the drawing, it will be appreciated that the gate structures of the P type transistors depicted in FIG. 3 or 4 may alternatively be used in the second region II.

Figure 6:
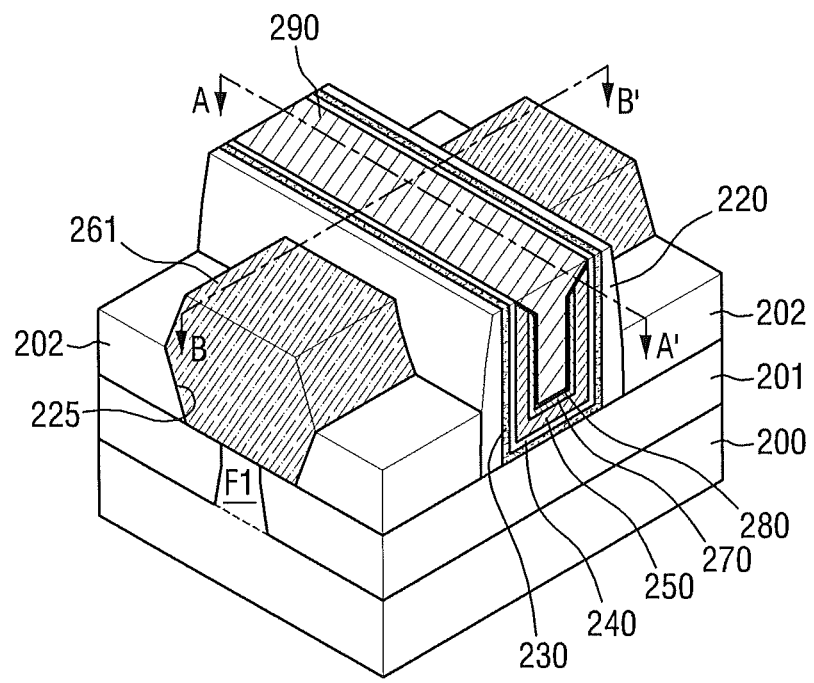
FIG. 6 is a perspective diagram of a semiconductor device in accordance with a fifth embodiment of the present inventive concept.
Figure 7:
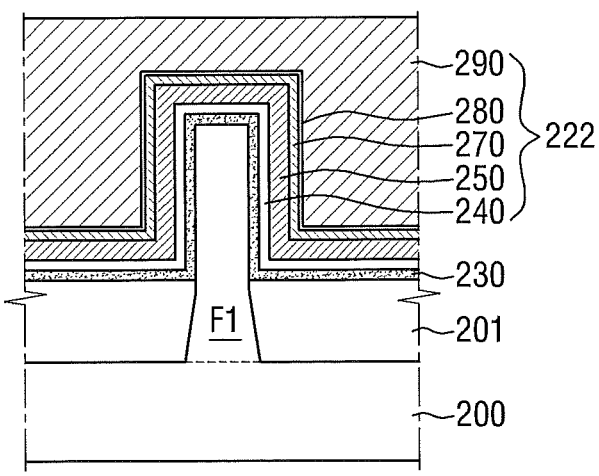
FIG. 7 is a cross-sectional view taken along line A-A' of FIG. 6.
Figure 8:
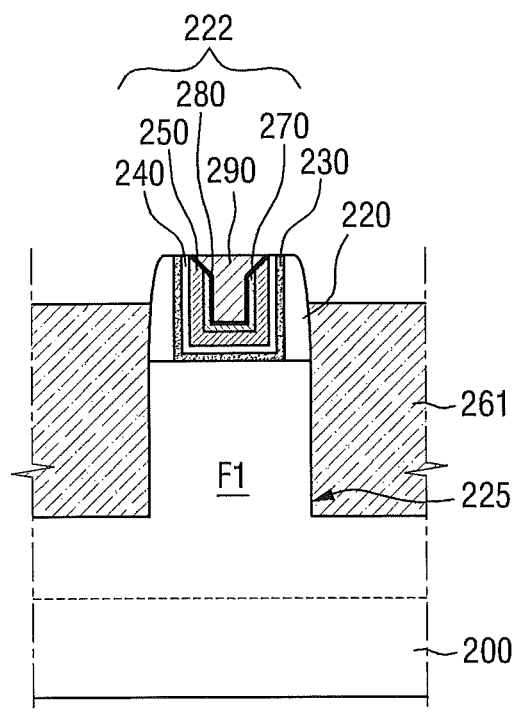
FIG. 8 is a cross-sectional view taken along line B-B' of FIG. 6.

FIG. 6 is a perspective view of a semiconductor device 5 in accordance with a fifth embodiment of the present inventive concept. FIG. 7 is a cross-sectional view taken along line A-A' of FIG. 6. FIG. 8 is a cross-sectional view taken along line B-B' of FIG. 6. FIGS. 6 to 8 depict embodiments of the inventive concept in which the gate of the P type transistor shown in FIG. 1 is applied to a fin type transistor (FinFET).

Referring to FIGS. 6 to 8, the semiconductor device 5 in accordance with the fifth embodiment of the present inventive concept may include a fin F1, a gate electrode 222, a recess 225, a source/drain 261 and the like.

The fin F1 may extend along a second direction Y1. The fin F1 may be a portion of the substrate 200, and may include an epitaxial layer grown from the substrate 200. An element isolation film 201 may cover the side surfaces of the fin F1.

The gate electrode 222 may be formed on the fin F1 to intersect the fin F1. The gate electrode 222 may extend along a first direction X1.

As illustrated, the gate electrode 222 may include the etch stop film 240, the P type work function adjusting film 250, the N type work function adjusting film 270, the adhesive film 280, the metal gate pattern 290 and the like.

A recess 225 may be formed in the fin F1 at both sides of the gate electrode 222. Since the sidewalls of the recess 225 are inclined, the width of the recess 225 may increase with increasing distance from the substrate 100. As illustrated in FIG. 6, the width of the recess 225 may be larger than the width of the fin F1.

The source/drain 261 is formed in the recess 225. The source/drain 261 may have an elevated source/drain shape. That is, the upper surface of the source/drain 261 may be higher than the lower surface of the element isolation film 201. Further, the source/drain 261 and the gate electrode 222 may be isolated from each other by the spacers 220. As shown in FIG. 6, two recesses 225 and two source/drains 261 may be provided, with one recess 225 and one source/drain 261 provided on either side of the gate electrode 222.

In a case where the semiconductor device 5 in accordance with the fifth embodiment of the present inventive concept is a P type transistor, the source/drain 261 may include a compressive stress material. For example, the compressive stress material may be a material having a lattice constant larger than that of Si, and may be, e.g., SiGe. The compressive stress material may apply compressive stress to the fin F1 to improve the mobility of carriers in a channel region.

Although not shown, it will be appreciated that the gate of the P type transistor shown in FIGS. 3 and 4 may also be applied to the fin type transistor pursuant to further embodiments of the present invention.

In a case where the gate of the N type transistors (e.g., the gate formed in the first region I of FIG. 5) according to embodiments of the inventive concept is applied to the fin type transistor, the source/drain 261 may contain the same material as that of the substrate, or compressive stress material. For example, if the substrate contains Si, the source/drain may contain Si or a material (e.g., SiC) having a lattice constant smaller than that of Si (for embodiments that include a silicon substrate).

Figure 9:
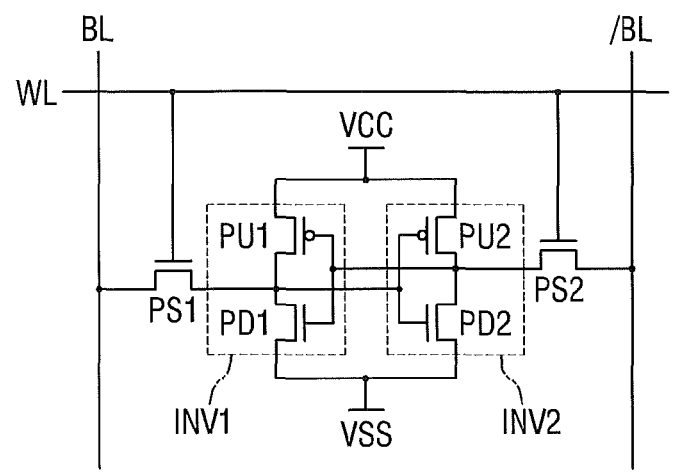
FIGS. 9 and 10 are a circuit diagram and a layout diagram, respectively, of a semiconductor device in accordance with a sixth embodiment of the present inventive concept.
Figure 10:
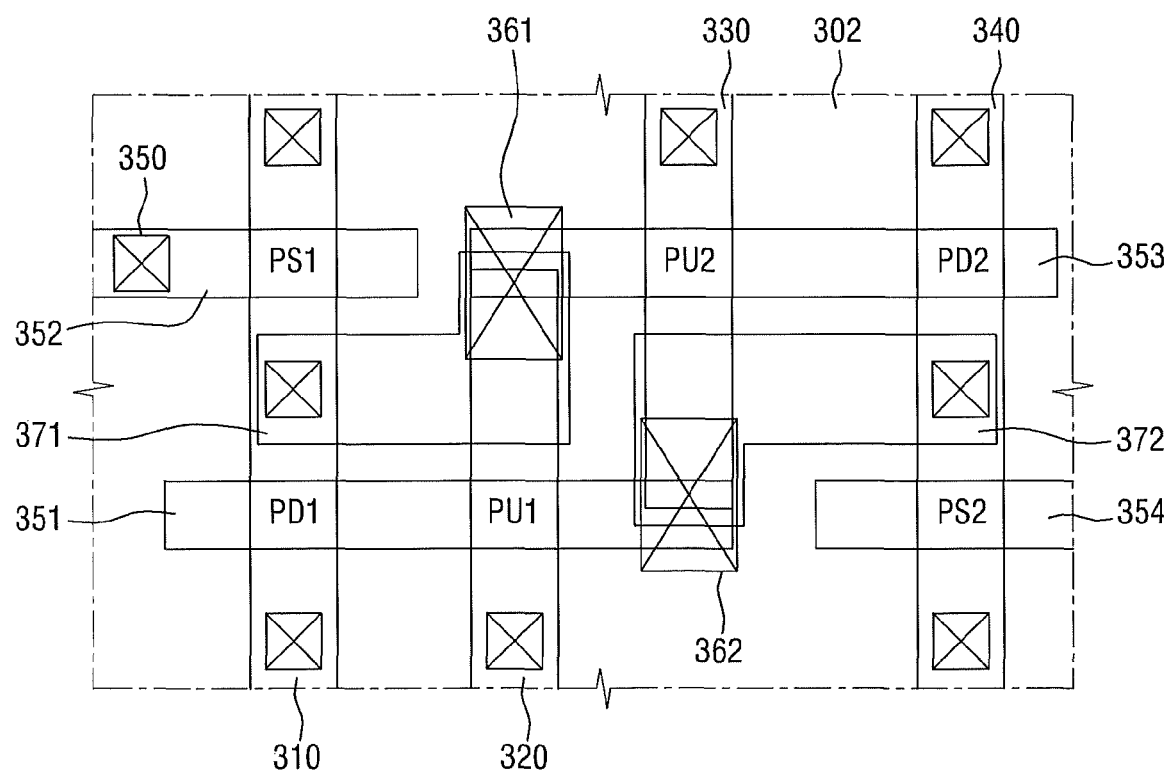

FIGS. 9 and 10 are a circuit diagram and a layout diagram of a semiconductor device 6 in accordance with a sixth embodiment of the present inventive concept.

Referring to FIGS. 9 and 10, the semiconductor device 6 in accordance with the sixth embodiment of the present inventive concept may include a pair of inverters INV1 and INV2 that are connected in parallel between a power supply node Vcc and a ground node Vss, and a first pass transistor PS1 and a second pass transistor PS2 that are connected to the respective output nodes of the inverters INV1 and INV2. The first pass transistor PS1 and the second pass transistor PS2 may be connected to a bit line BL and a complementary bit line /BL, respectively. The gates of the first pass transistor PS1 and the second pass transistor PS2 may be connected to a word line WL.

The first inverter INV1 includes a first pull-up transistor PU1 and a first pull-down transistor PD1 that are connected in series. The second inverter INV2 includes a second pull-up transistor PU2 and a second pull-down transistor PD2 that are connected in series. The first pull-up transistor PU1 and the second pull-up transistor PU2 may be PMOS transistors, and the first pull-down transistor PD1 and the second pull-down transistor PD2 may be NMOS transistors.

Further, the first inverter INV1 and the second inverter INV2 are configured such that an input node of the first inverter INV1 is connected to an output node of the second inverter INV2, and an input node of the second inverter INV2 is connected to an output node of the first inverter INV1 in order to constitute one latch circuit.

Referring to FIGS. 9 and 10, a first active region 310, a second active region 320, a third active region 330 and a fourth active region 340 that are separated from each other are formed to extend in one direction (e.g., the vertical direction of FIG. 10). The extended lengths of the second active region 320 and the third active region 330 may be shorter than those of the first active region 310 and the fourth active region 340.

Further, a first gate electrode 351, a second gate electrode 352, a third gate electrode 353, and a fourth gate electrode 354 extend in the other direction (e.g., the horizontal direction of FIG. 10), and are formed to intersect the first active region 310 to fourth active region 340. Specifically, the first gate electrode 351 may completely intersect the first active region 310 and the second active region 320 and may at least partially overlap an end point of the third active region 330. The third gate electrode 353 may completely intersect the fourth active region 340 and the third active region 330 and may at least partially overlap an end point of the second active region 320. The second gate electrode 352 and the fourth gate electrode 354 are formed to intersect the first active region 310 and the fourth active region 340 respectively.

As illustrated, the first pull-up transistor PU1 is defined around the intersection of the first gate electrode 351 and a second fin F2, the first pull-down transistor PD1 is defined around the intersection of the first gate electrode 351 and a first fin F1, and the first pass transistor PS1 is defined around the intersection of the second gate electrode 352 and the first fin F1. The second pull-up transistor PU2 is defined around the intersection of the third gate electrode 353 and the third active region 330, the second pull-down transistor PD2 is defined around the intersection of the third gate electrode 353 and the fourth active region 340, and the second pass transistor PS2 is defined around the intersection of the fourth gate electrode 354 and the fourth active region 340.

Source/drains may be formed on both sides of each intersection of the first to fourth gate electrodes 351 to 354 and the first to fourth fins 310, 320, 330 and 340.

Further, a number of contacts 350 may be formed.

Additionally, a shared contact 361 electrically connects the second active region 320, the third gate electrode 353 and wiring 371. A shared contact 362 electrically connects the third active region 330, the first gate electrode 351 and wiring 372.

For example, the first pull-up transistor PU1 and the second pull-up transistor PU2 may have a configuration described with reference to at least one of FIGS. 1 to 6. The first pull-down transistor PD1, the first pass transistor PS1, the second pull-down transistor PD2 and the second pass transistor PS2 may have a configuration including the gate formed in the first region I of FIG. 5.

Figure 11:
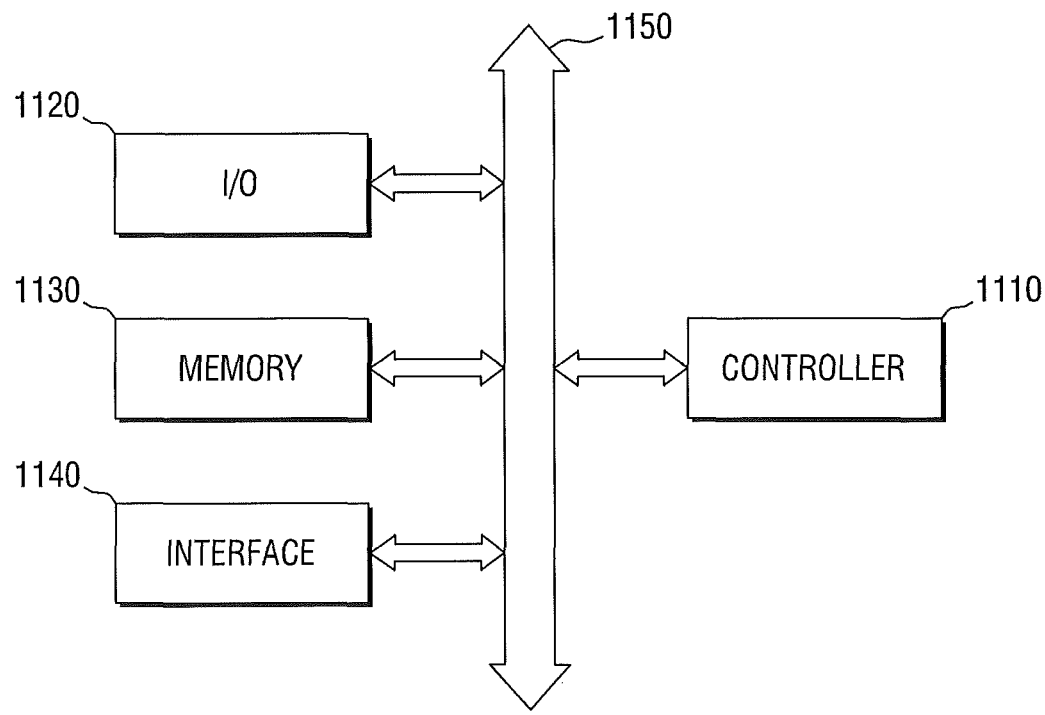
FIG. 11 is a block diagram of an electronic system including a semiconductor device in accordance with some embodiments of the present inventive concept.

FIG. 11 is a block diagram of an electronic system including a semiconductor device in accordance with some embodiments of the present inventive concept.

Referring to FIG. 11, an electronic system 1100 includes a controller 1110, an input/output (I/O) device 1120, a memory device 1130, an interface 1140, and a bus 1150. The controller 1110, the I/O device 1120, the memory device 1130, and/or the interface 1140 may be connected to each other through the bus 1150. The bus 1150 provides a path through which data may be transferred.

The controller 1110 may include at least one of a microprocessor, a digital signal processor, a micro-controller and other logic devices performing similar functions. The I/O device 1120 may comprise a keypad, a keyboard and/or a display device. The memory device 1130 may store data and/or commands. The interface 1140 serves to transmit/receive data to/from a communications network. The interface 1140 may be a wired interface or a wireless interface. For example, the interface 1140 may include an antenna or a wired/wireless transceiver. Although not shown in the drawings, the electronic system 1100 may further include a high-speed DRAM and/or SRAM as an operating memory for improving the operation of the controller 1110. The fin field effect transistor in accordance with embodiments of the present inventive concept may be provided in the memory device 1130, and/or may be provided as a part of the controller 1110 and the I/O device 1120.

The electronic system 1100 may be applied to, for example, a personal digital assistant (PDA), a portable computer, a web tablet, a wireless phone, a mobile phone, a digital music player, a memory card, or various electronic products capable of transmitting and/or receiving information in a wireless environment.

Figure 12:
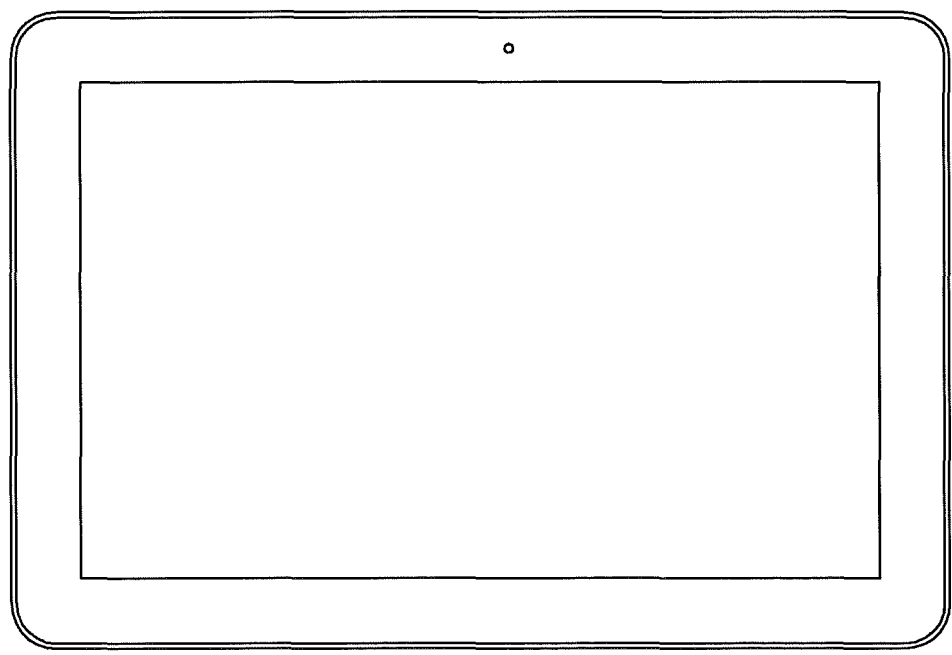
FIGS. 12 and 13 are exemplary semiconductor systems to which the semiconductor devices in accordance with some embodiments of the present inventive concept can be applied.
Figure 13:
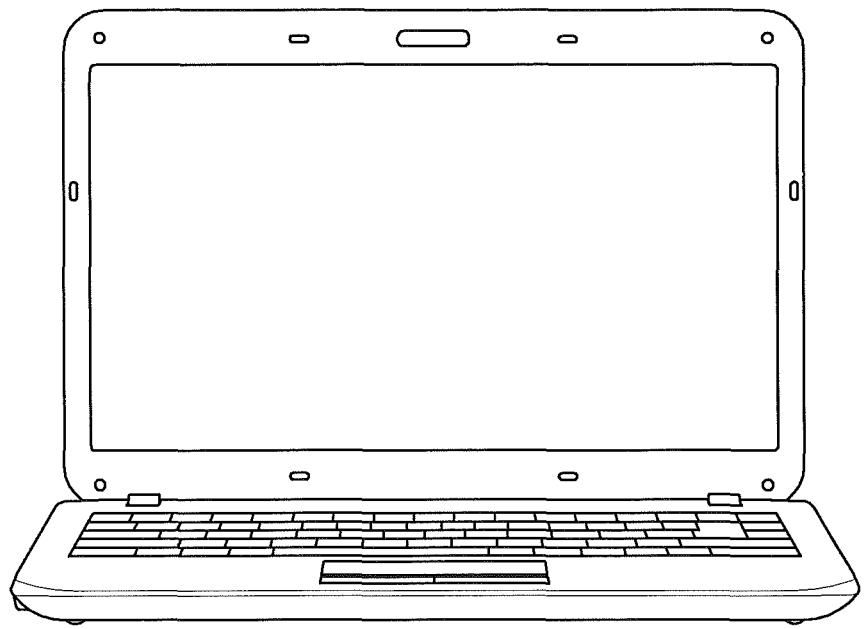

FIGS. 12 and 13 are exemplary semiconductor systems to which the semiconductor devices in accordance with some embodiments of the present inventive concept can be applied. FIG. 12 illustrates a tablet PC, and FIG. 13 illustrates a laptop. At least one of the semiconductor devices 1 to 6 in accordance with the embodiments of the present inventive concept may be used in the tablet PC, laptop, or the like. It will also be understood that the semiconductor devices in accordance with embodiments of the present inventive concept can be applied to other integrated circuit devices that are not illustrated.

Hereinafter, a method for fabricating the semiconductor devices in accordance with the first embodiment of the present inventive concept will be described with reference to FIGS. 1 and 14 to 21. FIGS. 14 to 21 are diagrams illustrating intermediate steps of a method for fabricating the semiconductor device in accordance with the first embodiment of the present inventive concept.

Figure 14:
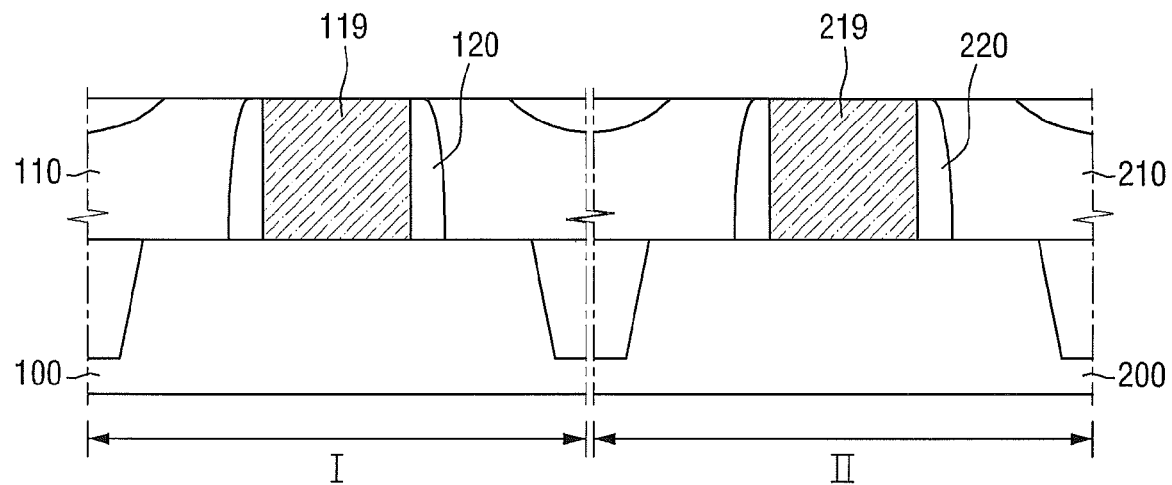
FIGS. 14 to 21 are diagrams illustrating intermediate steps in the fabrication of the semiconductor device in accordance with the first embodiment of the present inventive concept.

First, as shown in FIG. 14, a substrate 100 is provided in which a first region I and a second region II are defined.

In the first region I, a sacrificial gate pattern 119 is formed, and spacers 120 are formed at the sidewalls of the sacrificial gate pattern 119. An interlayer insulating film 110 surrounds the sacrificial gate pattern 119 and the spacers 120 while exposing an upper surface of the sacrificial gate pattern 119.

In the second region II, a sacrificial gate pattern 219 is formed, and spacers 220 are formed at the sidewalls of the sacrificial gate pattern 219. An interlayer insulating film 210 surrounds the sacrificial gate pattern 219 and the spacers 220 while exposing an upper surface of the sacrificial gate pattern 219.

The sacrificial gate pattern 119 and the sacrificial gate pattern 219 may be formed of, e.g., polysilicon, but they are not limited thereto.

Figure 15:
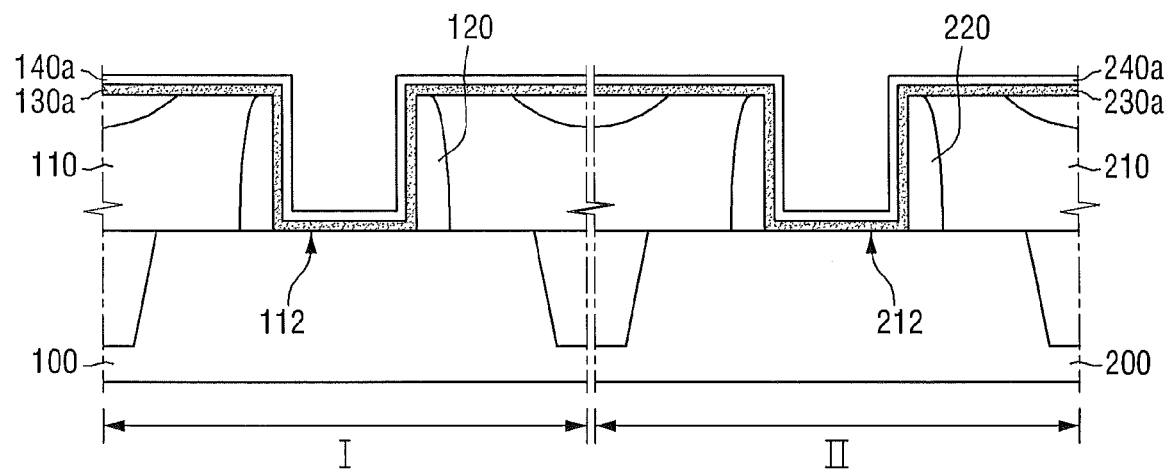

Referring to FIG. 15, the sacrificial gate pattern 119 and the sacrificial gate pattern 219 are removed so that the interlayer insulating film 110 includes the trench 112 in the first region I, and the interlayer insulating film 210 includes the trench 212 in the second region II.

Subsequently, a gate insulating film 130a is formed in the trench 112, and a gate insulating film 230a is formed in the trench 212. The gate insulating film 130a is formed conformally along the bottom surface and the sidewalls of the trench 112 and the upper surface of the interlayer insulating film 110. The gate insulating film 230a is formed conformally along the bottom surface and the sidewalls of the trench 212 and the upper surface of the interlayer insulating film 210. The gate insulating film 130a and the gate insulating film 230a may be high dielectric constant (high-k) films.

Then, an etch stop film 140a is formed on the gate insulating film 130a in the trench 112, and an etch stop film 240a is formed on the gate insulating film 230a in the trench 212. The etch stop film 140a and the etch stop film 240a are also formed on the interlayer insulating film 110 and the interlayer insulating film 210, respectively, and may be conformally formed.

Figure 16:
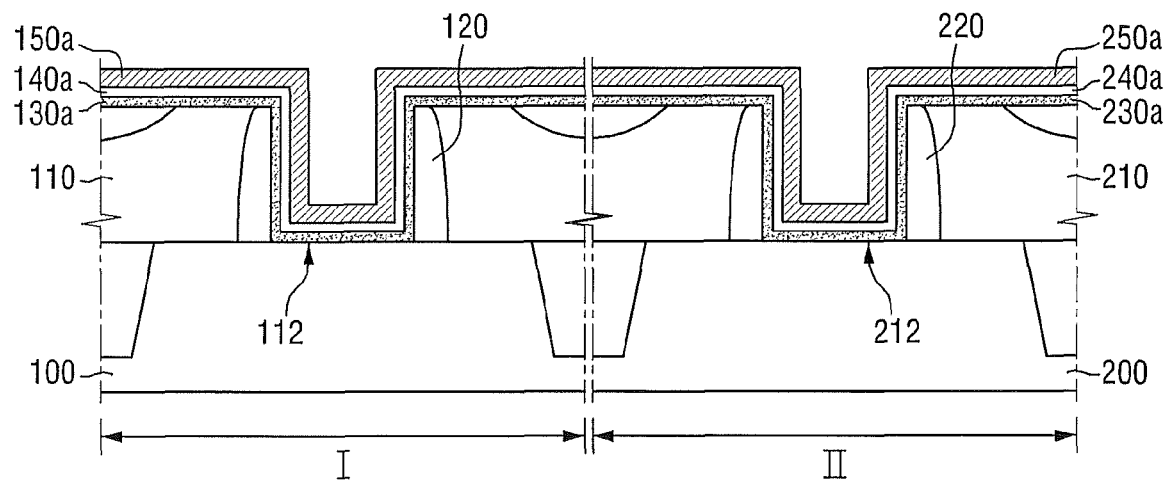

Referring to FIG. 16, P type work function adjusting films 150a and 250a are formed on the etch stop films 140a and 240a.

As illustrated, the P type work function adjusting films 150a and 250a are formed conformally along the bottom surface and the sidewalls of the trench 112 and the upper surface of the interlayer insulating film 110, and the bottom surface and the sidewalls of the trench 212 and the upper surface of the interlayer insulating film 210.

The P type work function adjusting films 150a and 250a may contain, e.g., TiN.

Figure 17:
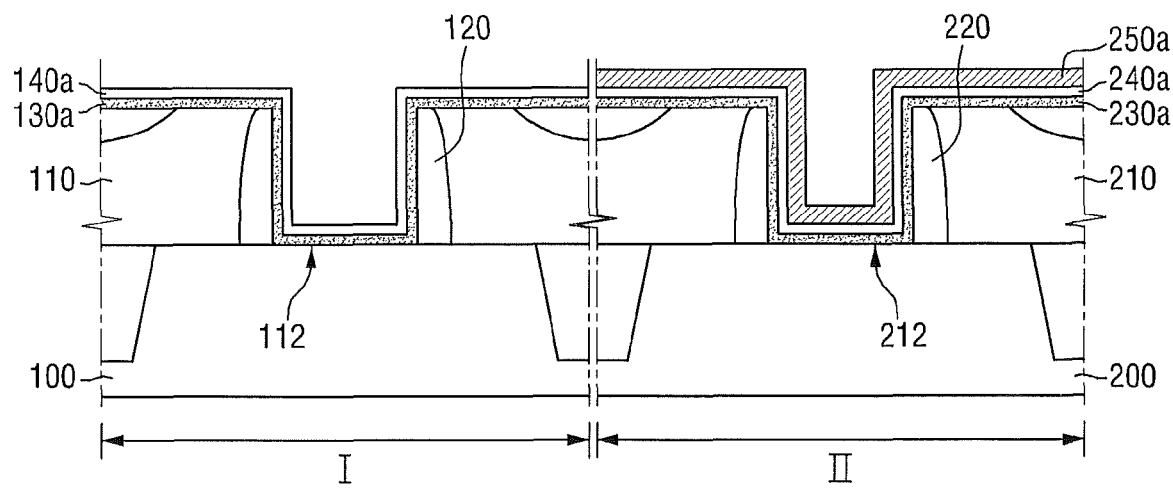

Referring to FIG. 17, the P type work function adjusting film 150a formed in the first region I is removed, and the P type work function adjusting film 250a formed in the second region II is retained. That is, the P type work function adjusting film 250a remains on the gate insulating film 230a in the trench 212.

Figure 18:
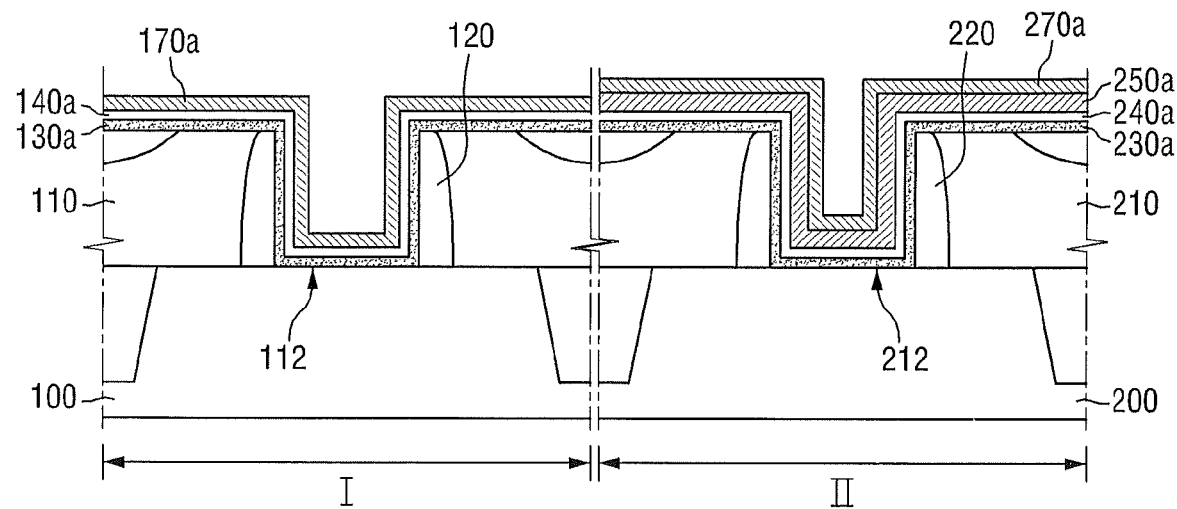

Referring to FIG. 18, an N type work function adjusting film 170a is formed on the etch stop film 140a in the trench 112, and an N type work function adjusting film 270a is formed on the P type work function adjusting film 250a in the trench 212.

As illustrated, the N type work function adjusting films 170a and 270a are formed conformally along the bottom surface and the sidewalls of the trench 112 and the upper surface of the interlayer insulating film 110, and the bottom surface and the sidewalls of the trench 212 and the upper surface of the interlayer insulating film 210.

Figure 19:
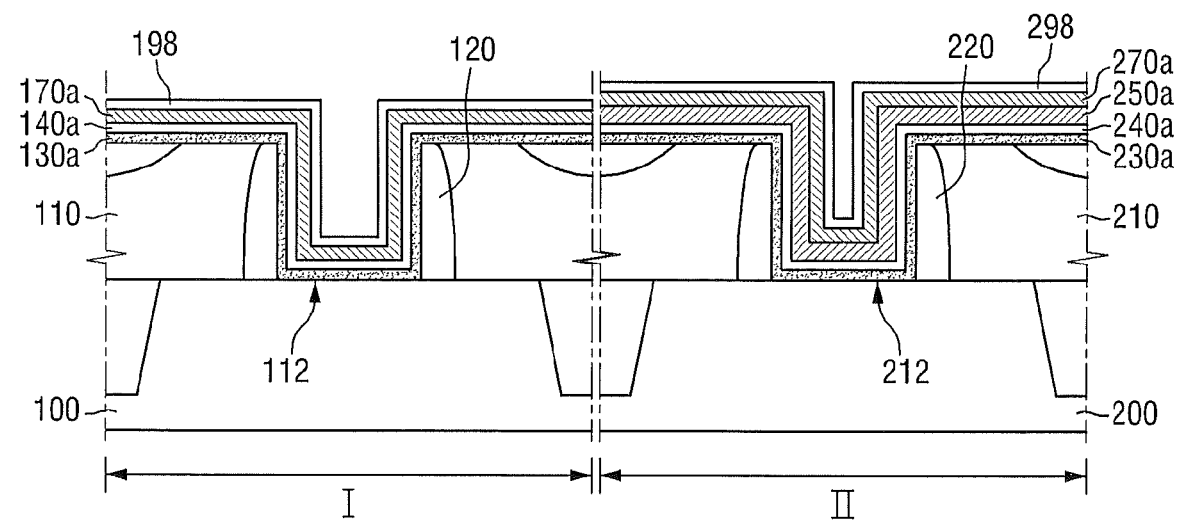

Referring to FIG. 19, a hard mask 198 is formed on the N type work function adjusting film 170a in the first region I, and a hard mask 298 is formed on the N type work function adjusting film 270a in the second region II.

As illustrated, the hard masks 198 and 298 are formed conformally along the bottom surface and the sidewalls of the trench 112 and the upper surface of the interlayer insulating film 110, and the bottom surface and the sidewalls of the trench 212 and the upper surface of the interlayer insulating film 210, respectively.

The hard masks 198 and 298 may be an oxide film, oxynitride film, nitride film or the like, but they are not limited thereto.

Figure 20:
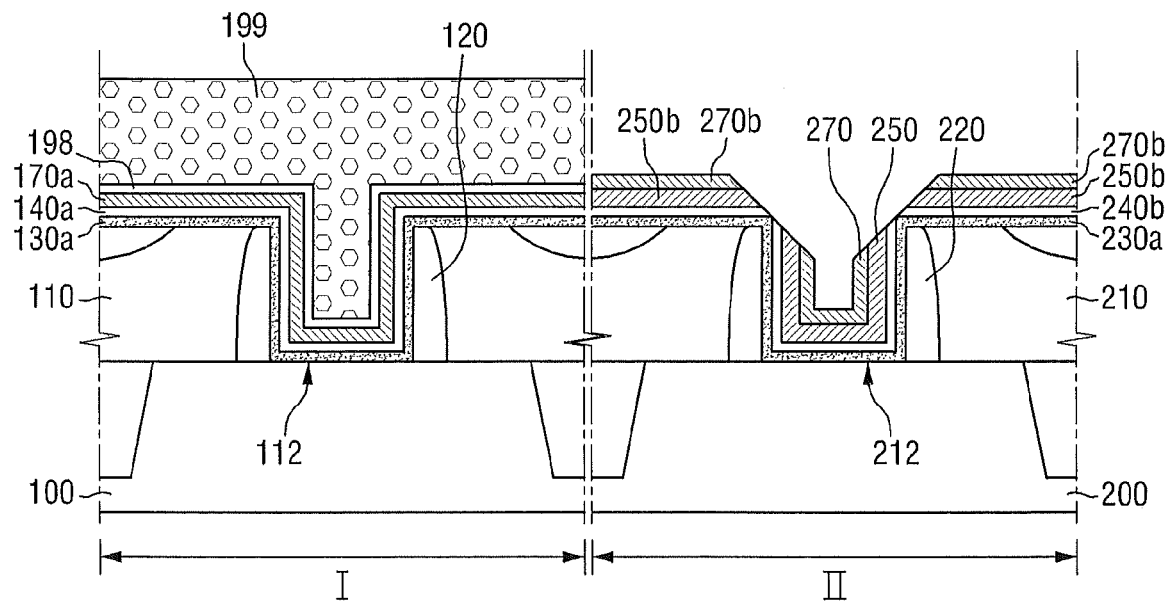

Referring to FIG. 20, a photoresist film 199 is formed that covers the first region I and exposes the second region II.

Subsequently, a portion of the N type work function adjusting film 270a (see FIG. 19) and a portion of the P type work function adjusting film 250a (see FIG. 19) in the second region II are removed. As a result, the N type work function adjusting film 270 includes the inclined surface 276 that form the an acute angle θ2 with respect to the first sidewall of the trench 212, and the P type work function adjusting film 250 includes the inclined surface 256 that forms an acute angle θ1 with respect to the first sidewall of the trench 212.

For example, reactive ion etching (RIE) may be used to perform etching. Specifically, etching may be performed to remove the hard mask 298 from the upper surface of the interlayer insulating film 210. While the hard mask 298 on the upper surface of the interlayer insulating film 210 is etched, edge portions of the P type work function adjusting film 250a and the N type work function adjusting film 270a where the electric field is concentrated are more etched. That is, the edge portions of the P type work function adjusting film 250a and the N type work function adjusting film 270a located at the entrance of the trench 212 are etched more heavily. Accordingly, as illustrated, the completed P type work function adjusting film 250 and N type work function adjusting film 270 may have a chamfered shape. That is, each of the P type work function adjusting film 250 and the N type work function adjusting film 270 may have inclined surfaces that form acute angles with respect to the sidewalls of the trench 212. Meanwhile, after chamfering the P type work function adjusting film 250a and the N type work function adjusting film 270a, a portion of the hard mask 298 may remain in the trench 212 of the second region II.

Then, the photoresist film 199 is removed.

Then, the remaining portion of the hard mask 298 is removed.

Figure 21:
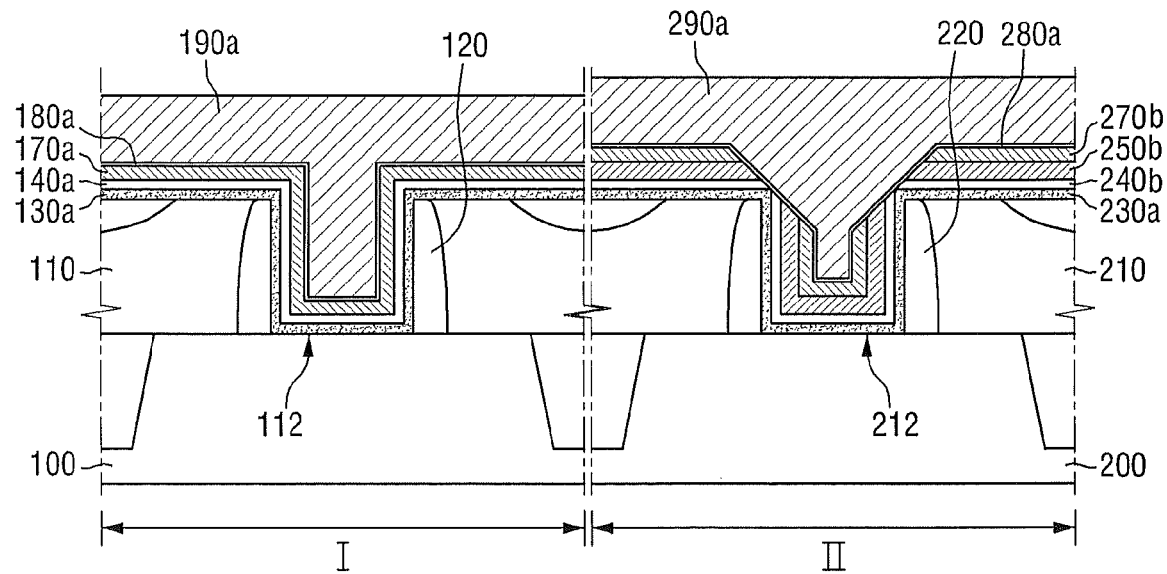

Referring to FIG. 21, an adhesive film 180a is formed on the N type work function adjusting film 170a in the trench 112, and an adhesive film 280a is formed on the N type work function adjusting film 270b in the trench 212.

Then, a metal gate pattern 190a is formed on the adhesive film 180a in the trench 112 to fill up the trench 112, and a metal gate pattern 290a is formed on the adhesive film 280a in the trench 212 to fill up the trench 212.

Since the P type work function adjusting film 250b and the N type work function adjusting film 270b are chamfered, the entrance of the trench 212 is wide. This may make it easier to fill the trench 212 with the metal gate pattern 290a.

Referring again to FIG. 1, a planarization process is performed to expose the upper surface of the interlayer insulating film 210. Through the planarization process, the first replacement metal gate of the N type transistor is completed in the first region I, and the second replacement metal gate of the P type transistor is completed in the second region II. The second replacement metal gate may include the chamfered P type work function adjusting film 250 and the N type work function adjusting film 270.

Figure 22:
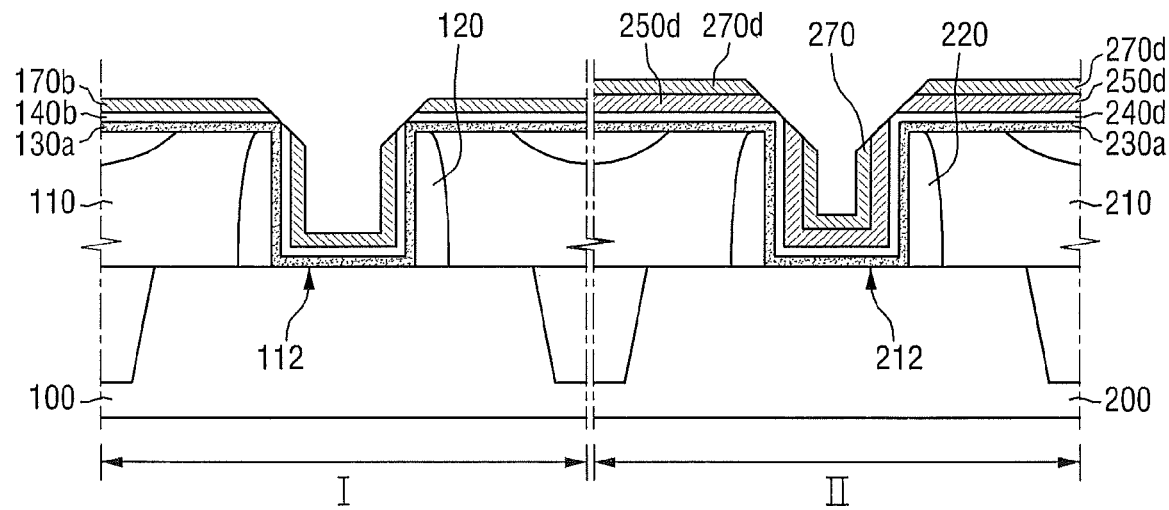
FIG. 22 is a diagram illustrating an intermediate step in the fabrication of the semiconductor device in accordance with the second embodiment of the present inventive concept.

Hereinafter, a method for fabricating the semiconductor device in accordance with the second embodiment of the present inventive concept will be described with reference to FIGS. 3 and 22. FIG. 22 is a diagram illustrating an intermediate step of a method for fabricating the semiconductor device in accordance with the second embodiment of the present inventive concept. For simplicity of description, the description below will focus on steps of the fabrication method that differ from the above-described method of fabricating the semiconductor device in accordance with the first embodiment of the present inventive concept. FIG. 22 is a diagram showing a fabrication step that would occur after the step of FIG. 19.

In the method for fabricating the semiconductor device in accordance with the first embodiment of the present inventive concept, the hard mask 198 is formed on the N type work function adjusting film 170a in the first region I, and the hard mask 298 is formed on the N type work function adjusting film 270a in the second region II (see FIG. 19). A portion of the P type work function adjusting film 250a and a portion of the N type work function adjusting film 270a formed in the second region II are etched using the photoresist film 199. Since the photoresist film 199 does not expose the first region I, the N type work function adjusting film 170a in the first region I is not etched (see FIG. 20).

In the method for fabricating the semiconductor device in accordance with the second embodiment of the present inventive concept, the photoresist film 199 (see FIG. 20) is not used. As such, the entire surfaces of the substrates 100 and 200 are etched. That is, while a portion of the P type work function adjusting film 250a (see FIG. 19) and a portion of the N type work function adjusting film 270a (see FIG. 19) in the second region II are etched, a portion of the N type work function adjusting film 170a in the first region I is also etched. As a result, the N type work function adjusting film 170 has an inclined surface having an acute angle with respect to the sidewalls of the trench 112. In this case, after chamfering the P type work function adjusting film 250a and the N type work function adjusting film 270a, a portion of the hard mask may remain in the trenches 112 and 212.

Then, the remaining portion of the hard mask is removed.

Referring again to FIG. 3, the adhesive film 280a is formed on the N type work function adjusting film 270b in the trench 212. Subsequently, the metal gate pattern 290a is formed on the adhesive film 280a in the trench 212 to fill up the trench 212. Then, a planarization process is performed to expose the upper surface of the interlayer insulating film 210.

Figure 23:
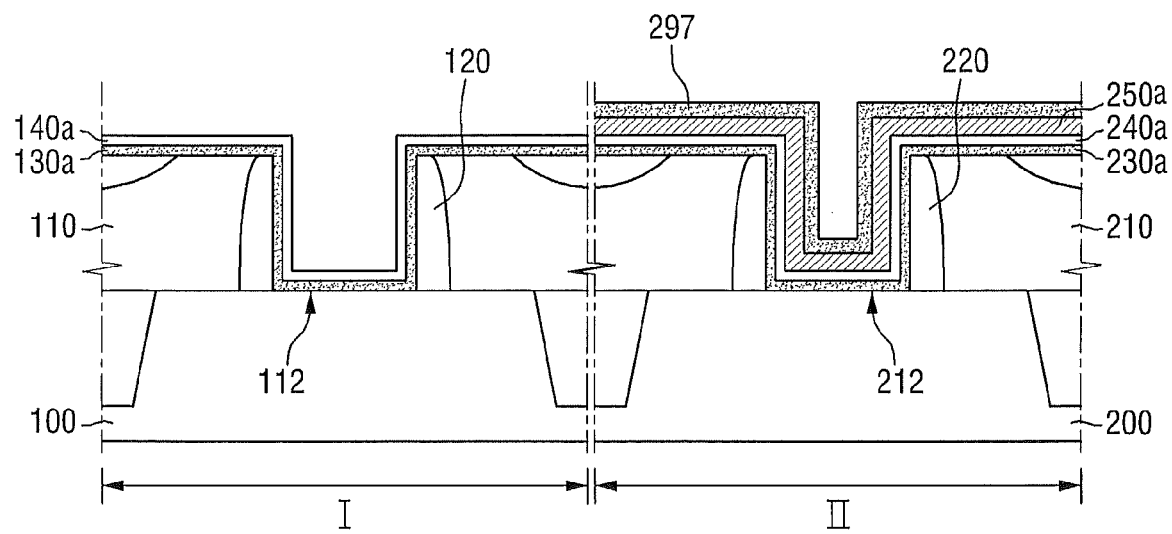
FIGS. 23 to 26 are diagrams illustrating intermediate steps in the fabrication of the semiconductor device in accordance with the third embodiment of the present inventive concept.

Hereinafter, a method for fabricating the semiconductor device in accordance with the third embodiment of the present inventive concept will be described with reference to FIGS. 23 to 26. FIGS. 23 to 26 are diagrams illustrating intermediate steps of a method for fabricating the semiconductor device in accordance with the third embodiment of the present inventive concept. FIG. 23 is a diagram showing a fabrication step that is performed after the step of FIG. 16.

Referring to FIG. 23, a hard mask pattern 297 is formed on the P type work function adjusting films 150a and 250a (see FIG. 16) that exposes the first region I and that covers the second region II.

Then, the P type work function adjusting film 150a of the first region I is removed using the hard mask pattern 297.

Figure 24:
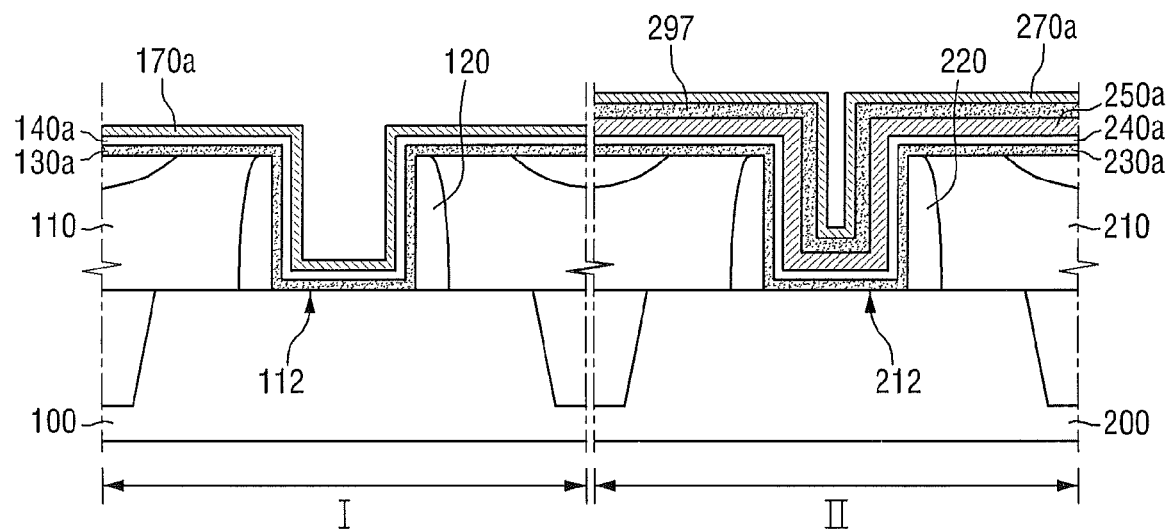

Referring to FIG. 24, after removing the P type work function adjusting film 150a of the first region I, the N type work function adjusting films 170a and 270a are formed on the first region I and the second region II.

Figure 25:
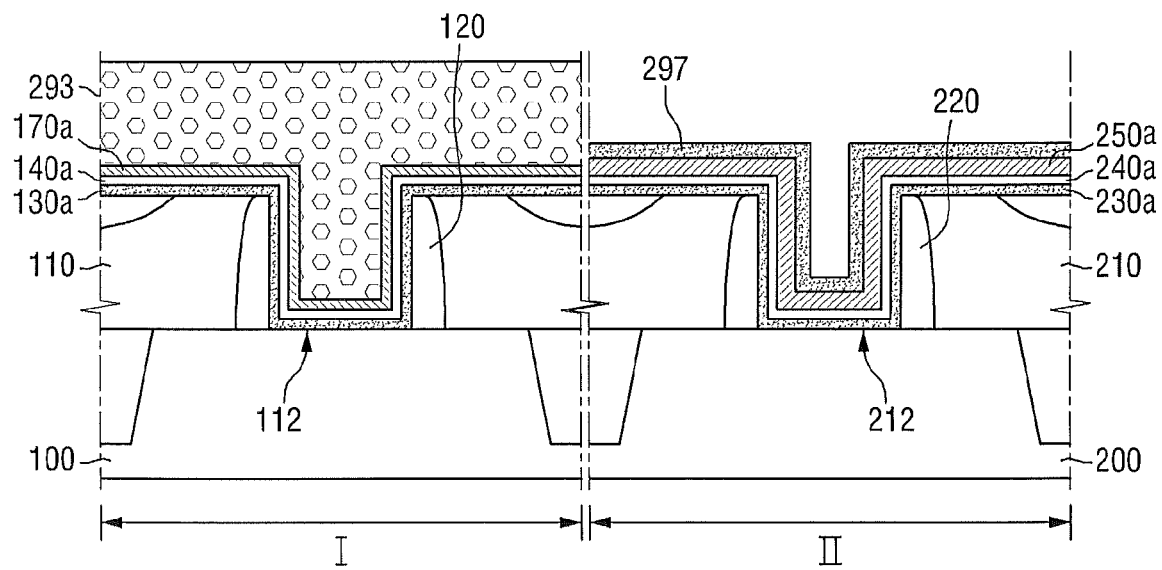

Referring to FIG. 25, a photoresist pattern 293 is formed on the N type work function adjusting films 170a and 270a that exposes the second region II and covers the first region I.

Subsequently, the N type work function adjusting film 270a of the second region II is removed. This may be accomplished, for example by wet etching using the photoresist pattern 293 as an etch mask. Since the hard mask pattern 297 is between the N type work function adjusting film 270a and the P type work function adjusting film 250a, the N type work function adjusting film 270a can be removed without affecting the P type work function adjusting film 250a.

Then, the hard mask pattern 297 is removed.

Figure 26:
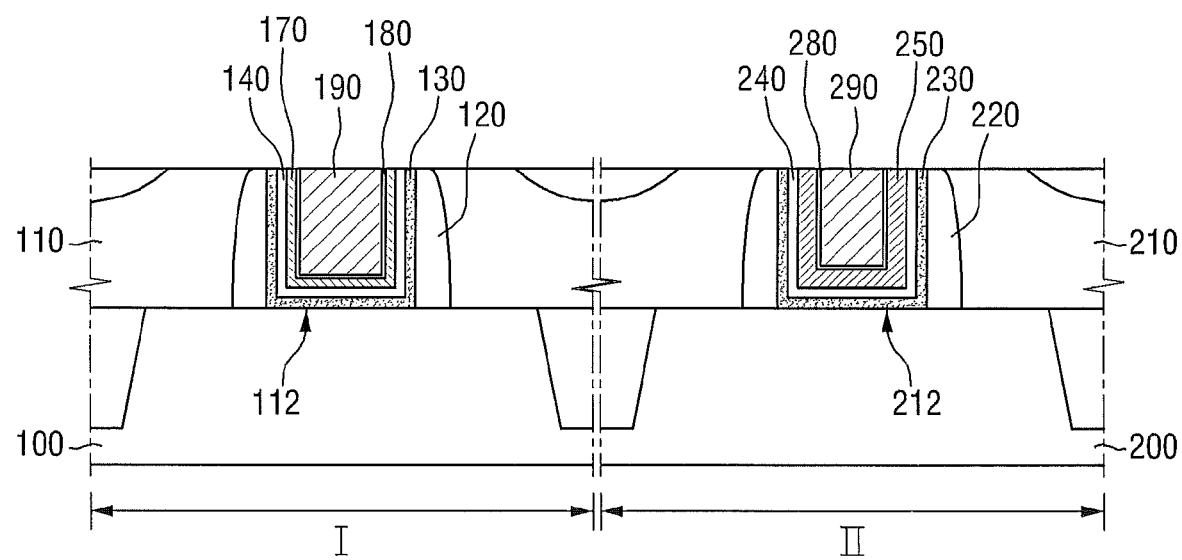

Referring to FIG. 26, the adhesive films 180 and 280 are formed on the N type work function adjusting film 170a (see FIG. 25) in the trench 112, and the P type work function adjusting film 250a (see FIG. 25) in the trench 212.

Then, a metal material is filled in the trenches 112 and 212. In the present embodiment, the N type work function adjusting film 270 is not included and only the P type work function adjusting film 250 is included in the trench 212. Accordingly, since the entrance of the trench 212 is wide, it is easier to deposit the metal material in the trench 212.

Then, a planarization process is performed to expose the upper surfaces of the interlayer insulating films 110 and 210.

Consequently, the second replacement metal gate of the second region II does not include the N type work function adjusting film 270 and includes only the P type work function adjusting film 250.

What is claimed is:

1. A semiconductor device comprising:
   a substrate including a first surface;
   an interlayer insulating film disposed on the first surface of the substrate and including a trench;
   a gate insulating film disposed in the trench;
   a first work function adjusting film disposed in the trench, and disposed on or above the gate insulating film;
   a second work function adjusting film disposed in the trench, and disposed on the first work function adjusting film; and
   a metal gate pattern disposed on or above the second work function adjusting film, and filling the trench,
   wherein the first work function adjusting film includes a first portion extending along a first sidewall of the trench, a second portion extending along a second sidewall of the trench and a third portion extending along a bottom surface of the trench,
   the first portion of the first work function adjusting film includes a top surface that is inclined with respect to the first surface of the substrate, and
   an uppermost point of the second work function adjusting film is below an uppermost point of the first work function adjusting film.

2. The semiconductor device of claim 1, wherein the gate insulating film is formed along the first sidewall, the second sidewall and the bottom surface of the trench.

3. The semiconductor device of claim 1, wherein the first portion of the first work function adjusting film includes a first sidewall and a second sidewall, the second sidewall of the first work function adjusting film contacting the second work function adjusting film,
   the top surface of the first work function adjusting film is inclined downwardly from a top of the first sidewall to a top of the second sidewall, and
   the top surface of the first work function adjusting film forms an acute angle with respect to the first sidewall of the first work function adjusting film.

4. The semiconductor device of claim 1, wherein the second work function adjusting film includes a first portion extending along the first portion of the first work function adjusting film, a second portion extending along the second portion of the first work function adjusting film and a third portion extending along the third portion of the first work function adjusting film, and
   the first portion of the second work function adjusting film includes a top surface that is inclined with respect to the first surface of the substrate.

5. The semiconductor device of claim 4, wherein the first portion of the second work function adjusting film includes a first sidewall and a second sidewall, the first sidewall of the second work function adjusting film contacting the first work function adjusting film,
   the top surface of the second work function adjusting film is inclined downwardly from a top of the first sidewall to a top of the second sidewall, and
   the top surface of the second work function adjusting film forms an acute angle with respect to the first sidewall of the second work function adjusting film.

6. The semiconductor device of claim 4, wherein the top surface of the first portion of the first work function adjusting film and the top surface of the first portion of the second work function adjusting film are co-planar.

7. The semiconductor device of claim 1, wherein the gate insulating film includes a first portion disposed on the first sidewall of the trench, a second portion disposed on the second sidewall of the trench, and a third portion disposed on the bottom surface of the trench.

8. The semiconductor device of claim 1, further comprising an etch stop film disposed along the bottom surface, the first sidewall and the second sidewall of the trench.

9. The semiconductor device of claim 8, wherein the etch stop film is disposed on the gate insulating film, and first work function adjusting film is disposed on the etch stop film.

10. The semiconductor device of claim 1, wherein a width of the first portion of the first work function adjusting film decreases as a distance from the bottom surface of the trench increases.

11. The semiconductor device of claim 1, further comprising an adhesive film disposed on the second work function adjusting film.

12. The semiconductor device of claim 11, wherein the adhesive film is also disposed on the top surface of the first portion of the first work function adjusting film and on a top surface of the second portion of the first work function adjusting film.

13. A semiconductor device comprising:
    a substrate including a first surface;
    an interlayer insulating film disposed on the first surface of the substrate, and including a first trench and a second trench which are separated from each other;

an NMOS transistor including a first metal gate formed in the first trench; and a PMOS transistor including a second metal gate formed in the second trench, wherein the first metal gate includes a first N-type work function adjusting film formed along a first sidewall, a second sidewall and a bottom surface of the first trench, the second metal gate includes a P-type work function adjusting film and a second N-type work function adjusting film which are stacked along a first sidewall, a second sidewall and a bottom surface of the second trench, the second N-type work function adjusting film includes a first portion extending along the first sidewall of the second trench, a second portion extending along the second sidewall of the second trench and a third portion extending along the bottom surface of the second trench, the first portion of the second N-type work function adjusting film includes a top surface that farms an acute angle with respect to a first sidewall of the first portion of the second N-type work function adjusting film, the first sidewall of the first portion of the second N-type work function adjusting film contacting the P-type work function adjusting film, the top surface of the first portion of the second N-type work function adjusting film being inclined with respect to the bottom surface of the second trench, and an uppermost point of the second N-type work function adjusting film is below an uppermost point of the P-type work function adjusting film.

14. The semiconductor device of claim 13, wherein the second metal gate includes an etch stop film on which the P-type work function adjusting film is formed.

15. A semiconductor device comprising:
a substrate;
an interlayer insulating film disposed on the substrate and including a trench;
a gate insulating film formed in the trench;
a first TiN film formed on the gate insulating film;
a TaN film formed on the first TiN film;
a second TiN film formed on the TaN film; and
a TiAl film formed on the second TiN film,
wherein at least one of the second TiN film and the TiAl film includes a first portion extending along a first sidewall of the trench, a second portion extending along a second sidewall of the trench and a third portion extending along a bottom surface of the trench, and the first portion includes a top surface that is inclined with respect to the bottom surface of the trench.

16. The semiconductor device of claim 15, wherein the top surface of the first portion forms an acute angle with respect to a sidewall of the first portion.

17. A semiconductor device, comprising:
a substrate;
an interlayer insulating film disposed on the substrate and including a trench;
a gate insulating film disposed on a first sidewall, a second sidewall and a bottom surface of the trench;
a first work function adjusting film disposed on or above the gate insulating film, the first work function adjusting film having a first sidewall, a second sidewall and a bottom surface;
a second work function adjusting film disposed between the first work function adjusting film and the gate insulating film;
a metal gate pattern disposed on or above the first work function adjusting film,
wherein a top surface of the first sidewall of the first work function adjusting film and a top surface of the second sidewall of the first work function adjusting film are chamfered,
at least one of the top surface of the first sidewall of the first work function adjusting film and the top surface of the second sidewall of the first work function adjusting film is below a top surface of the metal gate pattern, and
an uppermost point of the second work function adjusting film is below an uppermost point of the first work function adjusting film.

18. The semiconductor device of claim 17, further comprising an etch stop film disposed between the gate insulating film and the first work function adjusting film; and
an adhesive film disposed between the first work function adjusting film and the metal gate pattern.

19. The semiconductor device of claim 17, wherein the second work adjusting film has a first sidewall, a second sidewall and a bottom surface, and
each of an upper portion of the first sidewall of the second work function adjusting film and an upper portion of the second sidewall of the second work function adjusting film is chamfered.

* * * * *

UNITED STATES PATENT AND TRADEMARK OFFICE
CERTIFICATE OF CORRECTION

PATENT NO.       : 9,324,716 B2                                     Page 1 of 1
APPLICATION NO.  : 13/832599
DATED            : April 26, 2016
INVENTOR(S)      : Kim et al.

It is certified that error appears in the above-identified patent and that said Letters Patent is hereby corrected as shown below:

<u>In the Claims:</u>
Column 16, Claim 9, Line 48: Please correct "and first work"
　　　　　　　　　　　　　　　to read -- and the first work --

Column 18, Claim 17, Line 29: Please correct "the second work function"
　　　　　　　　　　　　　　　to read -- the first work function --

Column 18, Claim 17, Line 30: Please correct "of the first work function"
　　　　　　　　　　　　　　　to read -- of the second work function --

Column 18, Claim 18, Line 34: Please correct "the first work function"
　　　　　　　　　　　　　　　to read -- the second work function --

Signed and Sealed this
Twenty-first Day of June, 2016

Michelle K. Lee
*Director of the United States Patent and Trademark Office*